United States Patent
Shu et al.

(10) Patent No.: US 9,633,899 B2
(45) Date of Patent: Apr. 25, 2017

(54) METHOD FOR PATTERNING A GRAPHENE LAYER AND METHOD FOR MANUFACTURING A DISPLAY SUBSTRATE

(71) Applicant: BOE TECHNOLOGY GROUP CO., LTD., Beijing (CN)

(72) Inventors: Shi Shu, Beijing (CN); Zhijun Lv, Beijing (CN); Jingxia Gu, Beijing (CN); Yue Shi, Beijing (CN); Fangzhen Zhang, Beijing (CN); Bing Sun, Beijing (CN); Chuanxiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 141 days.

(21) Appl. No.: 14/513,324

(22) Filed: Oct. 14, 2014

(65) Prior Publication Data

US 2015/0357239 A1    Dec. 10, 2015

(30) Foreign Application Priority Data

Jun. 10, 2014   (CN) .......................... 2014 1 0256945

(51) Int. Cl.
*H01L 21/768*    (2006.01)
*H01L 21/3205*    (2006.01)
(Continued)

(52) U.S. Cl.
CPC .... *H01L 21/76892* (2013.01); *H01L 21/3081* (2013.01); *H01L 21/32055* (2013.01);
(Continued)

(58) Field of Classification Search
CPC ......... H01L 21/76892; H01L 23/49877; H01L 21/32055; H05K 3/064; H05K 2201/10128; H05K 2201/0323; H05K 2201/0108
(Continued)

(56) References Cited

U.S. PATENT DOCUMENTS 5,170,228 A * 12/1992 Sasaki ................. H01L 27/1443
                                                      257/184
2008/0057445 A1 * 3/2008 Brueck ............... H01L 21/0337
                                                      430/323
(Continued)

FOREIGN PATENT DOCUMENTS

| CN | 102881654 A | 1/2013 |
| CN | 103204495 A | 7/2013 |

(Continued)

OTHER PUBLICATIONS

First Office Action regarding Chinese application No. 201410256945.X, dated Apr. 20, 2016. Translation provided by Dragon Intellectual Property Law Firm.
(Continued)

*Primary Examiner* — Jerome Jackson, Jr.
*Assistant Examiner* — Bo Fan
(74) *Attorney, Agent, or Firm* — Harness, Dickey & Pierce, P.L.C.

(57) ABSTRACT

The invention provides a method for patterning a graphene layer and a method for manufacturing a display substrate. The method for patterning a graphene layer comprises: forming an isolation layer on a graphene layer; forming a photoresist layer on the isolation layer; patterning the photoresist layer; etching the isolation layer according to the patterned photoresist layer to form a patterned isolation layer; etching the graphene layer according to the patterned
(Continued)

photoresist layer to form a patterned graphene layer; and removing the patterned isolation layer. In the method of the invention, the unfavorable condition of the prior art may be avoided that a graphene film sloughs off or a photoresist remains on a graphene film when a photoresist material is peeled off, and the product yield can be improved in the case that the production cost is controlled.

15 Claims, 9 Drawing Sheets

(51) Int. Cl.
    *H01L 23/498*      (2006.01)
    *H05K 3/06*      (2006.01)
    *H01L 21/308*      (2006.01)

(52) U.S. Cl.
    CPC ....... *H01L 23/49877* (2013.01); *H05K 3/064* (2013.01); *H01L 2924/0002* (2013.01); *H05K 2201/0108* (2013.01); *H05K 2201/0323* (2013.01); *H05K 2201/10128* (2013.01)

(58) Field of Classification Search
    USPC ............ 257/76, 29, 727, 369; 438/163, 731
    See application file for complete search history.

(56) References Cited

U.S. PATENT DOCUMENTS

| | | | |
|---|---|---|---|
| 2011/0220865 A1* | 9/2011 | Miyata | B82Y 10/00 257/12 |
| 2012/0248416 A1 | 10/2012 | Zhou et al. | |
| 2013/0149463 A1* | 6/2013 | Zhang | C23C 18/06 427/552 |
| 2014/0091280 A1* | 4/2014 | Sun | H01L 33/0041 257/29 |

FOREIGN PATENT DOCUMENTS

| | | |
|---|---|---|
| CN | 103280398 A | 9/2013 |
| CN | 103295912 A | 9/2013 |
| TW | 201337007 A | 9/2013 |

OTHER PUBLICATIONS

Second Office Action regarding Chinese application No. 201410256945.X, dated Sep. 8, 2016. Translation provided by Dragon Intellectual Property Law Firm.

Third Office Action regarding Chinese application No. 201410256945.X, dated Dec. 5, 2016. Translation provided by Dragon Intellectual Property Law Firm.

* cited by examiner

METHOD FOR PATTERNING A GRAPHENE LAYER AND METHOD FOR MANUFACTURING A DISPLAY SUBSTRATE

CROSS REFERENCE OF THE RELATED APPLICATION

The present application claims priority to the Chinese application No. 201410256945.X filed on Jun. 10, 2014, entitled with "Method for Patterning a Graphene Layer and Method for Manufacturing a Display Substrate", the entire contents of which are incorporated herein by reference.

FIELD OF THE INVENTION

The present invention relates to the field of electronic technologies, and in particular, to a method for patterning graphene layer and a method for manufacturing a display substrate.

DESCRIPTION OF THE PRIOR ART

At present, Indium Tin Oxide (ITO) material is widely applied to a variety of fields to prepare a transparent conducting film. However, since element indium is a rare metal, and the oxides of indium are toxic and thus are environment-unfriendly, a substitute material for ITO is urgently required currently. Under such a background, graphene material becomes a good substitute material for ITO and attracts people's much attention.

Graphene material is a single-layer atom film formed of sp2-hybridized carbon atoms, and it may be a substitute material for ITO. At present, a technology of preparing a graphene film and transferring the graphene film onto a glass substrate has been developed. For the patterning of graphene film, the currently mature semiconductor preparation process may be employed, that is, a photoresist is coated on the surface of a graphene film, and a patterned photoresist is obtained via a exposing-developing process, then the graphene film is dry-etched, and finally the photoresist is peeled off to obtain a patterned graphene film. However, since a graphene film is very thin, the graphene film may slough off or a photoresist may remain on the graphene film during the peeling of the conventional photoresist, thus the product yield may be lowered. In addition, the development of a specific photoresist material and a specific process will add the cost, and production in a large scale will be more difficult. Thus it is necessary to develop a low-cost patterning process.

SUMMARY OF THE INVENTION

The embodiments of the invention provides a method for patterning graphene layer and a method for manufacturing a display substrate, thereby the product yield can be improved in the case that the production cost is controlled.

To attain the above objects, the invention employs the following technical solutions.

In one aspect of the invention, there provides a method for patterning graphene layer, which comprises:
 forming an isolation layer on a graphene layer;
 forming a photoresist layer on the isolation layer;
 patterning the photoresist layer;
 etching the isolation layer according to the patterned photoresist layer to form a patterned isolation layer;
 etching the graphene layer according to the patterned isolation layer to form a patterned graphene layer; and
 removing the patterned isolation layer.

In one embodiment of the invention, the method further includes: peeling off the patterned photoresist layer after etching the isolation layer according to the patterned photoresist layer to form a patterned isolation layer.

In one embodiment of the invention, the method further includes: forming the graphene layer on a resin base before forming an isolation layer on a graphene layer; and
 forming a resin film with the patterned graphene layer after removing the patterned isolation layer.

In one embodiment of the invention, the method further includes:
 transferring the patterned graphene layer on the resin film to a substrate via a transfer process; and
 removing the resin base at the resin film.

In one embodiment of the invention, the step of forming the graphene layer on a resin base includes:
 spin-coating a single layer or multiple layers of water-soluble graphene material on the resin base to form the graphene layer.

In one embodiment of the invention, the step of forming the graphene layer on a resin base includes:
 depositing a graphene material on a metal base to form the graphene layer;
 spin-coating a resin material on the graphene layer to form the resin base; and
 etching and removing the metal base.

In one embodiment of the invention, a material of which the metal base is formed includes any one of copper, nickel or copper-nickel alloy.

In an embodiment of the invention, the isolation layer is formed of an inorganic silicon compound material, and preferably the inorganic silicon compound material includes silicon nitride.

In one embodiment of the invention, the step of removing the patterned isolation layer includes:
 corroding and removing the patterned isolation layer via hydrofluoric acid.

In one embodiment of the invention, the graphene layer is formed on a substrate.

In one embodiment of the invention, the material of which the isolation layer is formed is a metal material, and preferably the metal material includes any one of copper, nickel or copper-nickel alloy.

In another aspect of the invention, there provides a method for manufacturing a display substrate, which comprises manufacturing a structure formed of the patterned graphene layer by any one of the above methods.

In the method for patterning graphene layer according to the embodiments of the invention, by providing an isolation layer between a graphene layer and a photoresist and removing the isolation layer on the graphene layer after peeling off the photoresist, the unfavorable condition of the prior art may be avoided that a graphene film sloughs off or a photoresist remains on a graphene film when a photoresist material is peeled off, and thus the product yield can be improved in the case that the production cost is controlled.

BRIEF DESCRIPTION OF THE DRAWINGS

In order to more clearly illustrate the technical solutions of the embodiments of the invention or the prior art, the drawings required in the description of the embodiments or the prior art will be briefly introduced below. Apparently, the drawings in the description below only show some embodiments of the invention, and other drawings may also be obtained by a person skilled in the art based on these drawings without creative work.

DETAILED DESCRIPTION OF THE PREFERRED EMBODIMENTS

The method for patterning graphene layer according to the embodiments of the invention will be described in detail below in conjunction with the drawings. The technical solutions in the embodiments of the invention will be described clearly and fully. Apparently, the embodiments described are only a part of the embodiments of the invention, rather than being the whole embodiments. All other embodiments made by a person skilled in the art based on the embodiments of the invention without creative work pertain to the protection scope of the invention.

Figure 1:
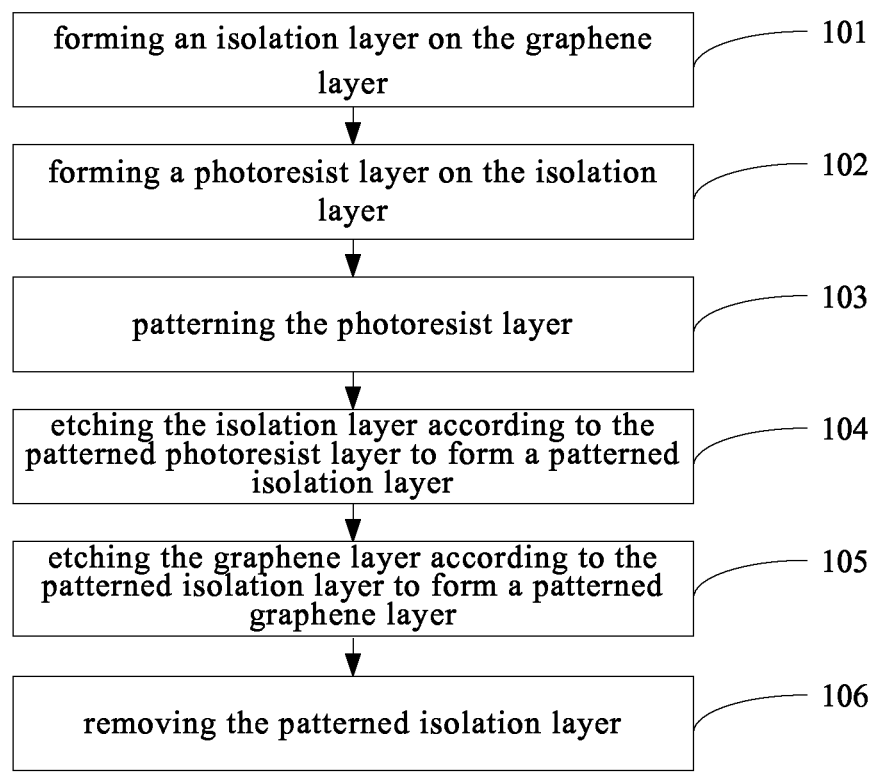
FIG. 1 is a schematic flow chart of a method for patterning graphene layer according to one embodiment of the invention.

In one aspect of the invention, there provides a method for patterning a graphene layer. Referring to FIG. 1, the method comprises the steps below:

101: forming an isolation layer on a graphene layer;
102: forming a photoresist layer on the isolation layer;
103: patterning the photoresist layer;
104: etching the isolation layer according to the patterned photoresist layer to form a patterned isolation layer;
105: etching the graphene layer according to the patterned isolation layer to form a patterned graphene layer; and
106: removing the patterned isolation layer.

It can be seen that, the removal of the material of the isolation layer employed in the above embodiment will not influence the integrity of the graphene layer covered. For example, the removing process employed for the isolation layer, such as a peeling process or an etching process, will not influence the structure of the graphene layer. Additionally, during removing the isolation layer, all the materials for manufacturing the isolation layer can be removed completely. Optionally, the method further includes: peeling off the patterned photoresist layer after step 104. Here, the specific steps of the photoresist layer peeling process will not be specifically limited, and since the photoresist layer is covered on the isolation layer, the peeling of the photoresist layer may be performed in any step before peeling off the isolation layer. That is, the step of peeling off the patterned photoresist layer may be performed after step 104 or after step 105.

In the method for patterning a graphene layer according to the embodiments of the invention, by providing an isolation layer between a graphene layer and a photoresist and removing the isolation layer on the graphene layer after peeling off the photoresist, the unfavorable condition of the prior art may be avoided that a graphene film sloughs off or a photoresist remains on a graphene film when a photoresist material is peeled off, and thus the product yield can be improved in the case that the production cost is controlled.

Figure 2:
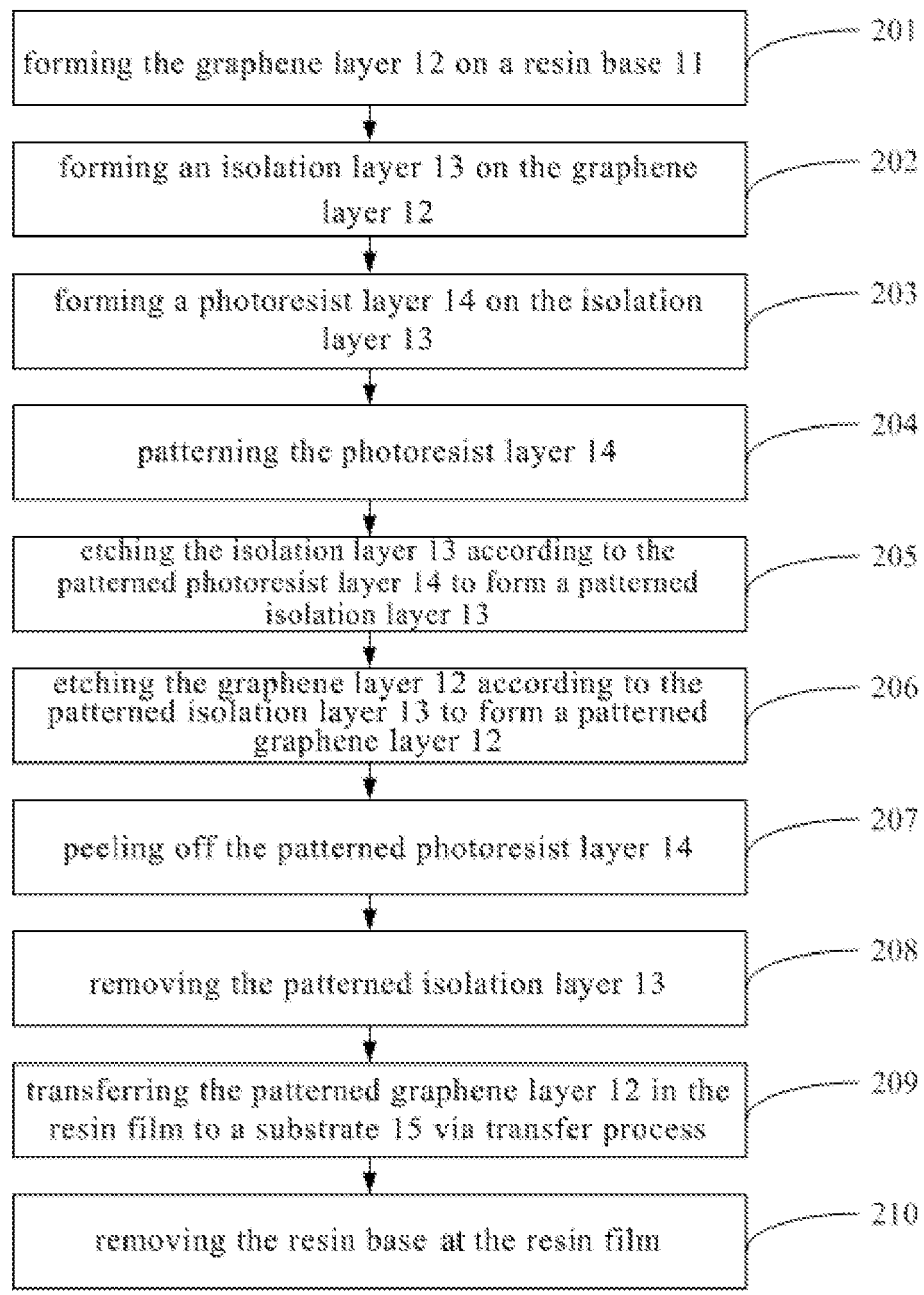
FIG. 2 is a schematic flow chart of a method for patterning graphene layer according to another embodiment of the invention.
Figure 3:
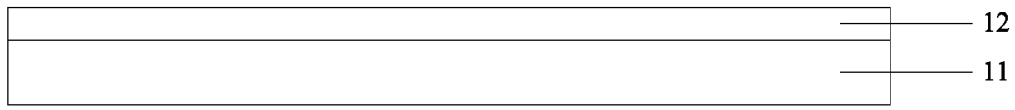
FIG. 3 is a schematic diagram showing the sectional structure of a resin film during the process for patterning a graphene layer according to another embodiment of the invention.

In one embodiment of the invention, the isolation layer is made of an inorganic silicon compound material or a metal material. Specifically, referring to FIG. 2, the method for patterning graphene layer according to the invention comprises the steps below:

201: forming the graphene layer 12 on a resin base 11;

Referring to FIG. 3, the resin base 11 may be dissolved in an organic solvent. Specifically, polymethyl methacrylate (PMMA) can be used as a material of the resin base. The step 201 may comprise: depositing a graphene material on a metal base to form the graphene layer; spin-coating a resin material on the graphene layer to form the resin base; etching and removing the metal base to form the graphene layer 12 on a resin base 11. Specifically, a layer of graphene material is deposited on the metal base via Plasma Enhanced Chemical Vapor Deposition (PECVD). Or, the step 201 may comprise: spin-coating a layer of a single-layer or multi-layer water-soluble graphene material on the resin base to form the graphene layer 12.

Figure 4:
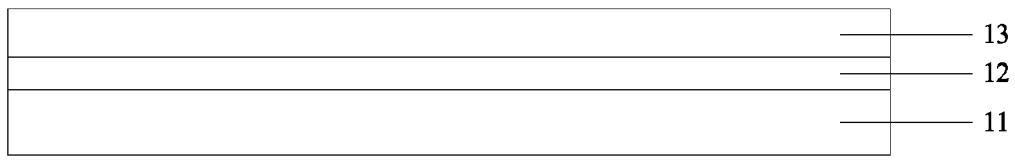
FIG. 4 is a schematic diagram showing the sectional structure of a resin film during the process for patterning a graphene layer according to another embodiment of the invention.

202: forming an isolation layer 13 on the graphene layer 12;

Referring to FIG. 4, an isolation layer 13 with a thickness of 1000Å to 6000Å may be deposited on the graphene layer. The material of the isolation layer 13 is generally an inorganic silicon compound material such silicon nitride. Or, a layer of metal film with a thickness of 1000Å to 7000Å may be prepared on the graphene layer 12 as the isolation layer 13 via magnetron sputtering. The metal material of the metal film may be copper, nickel or copper-nickel alloy.

Figure 5:
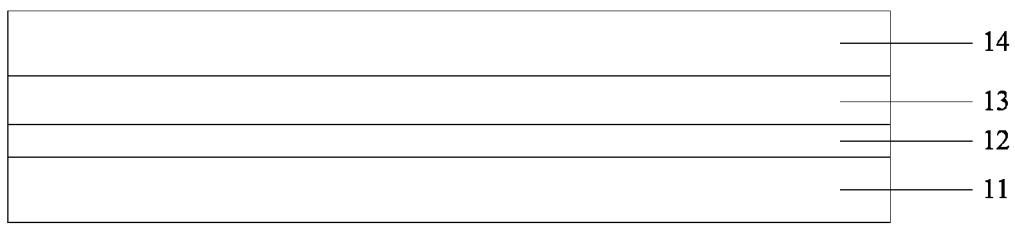
FIG. 5 is a schematic diagram showing the sectional structure of a resin film during the process for patterning a graphene layer according to another embodiment of the invention.

203: forming a photoresist layer 14 on the isolation layer 13;

Referring to FIG. 5, a photoresist layer 14 is coated on the graphene layer 12.

Figure 6:
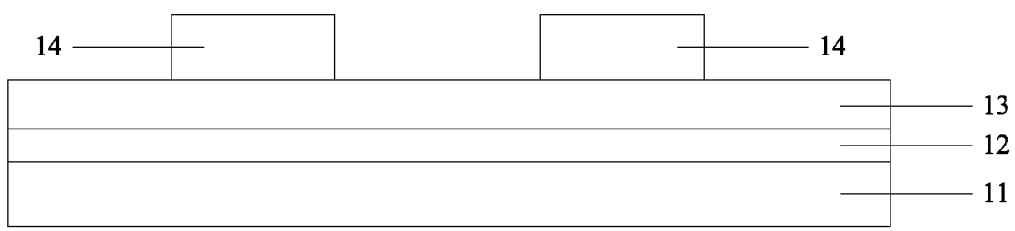
FIG. 6 is a schematic diagram showing the sectional structure of a resin resin during the process for patterning a graphene layer according to another embodiment of the invention.

204: patterning the photoresist layer 14;

Referring to FIG. 6, the step 204 specifically comprises: selectively exposing the photoresist on the photoresist layer 14 according to the requirements for patterning a graphene layer, and dissolving and removing the exposed photoresist by a chemical action and curing the unexposed photoresist. That is, forming a patterned photoresist layer 14 by exposing and developing the photoresist layer 14, and exposing the isolation layer 13 on which the photoresist is removed after exposing and developing the photoresist layer 14.

Figure 7:
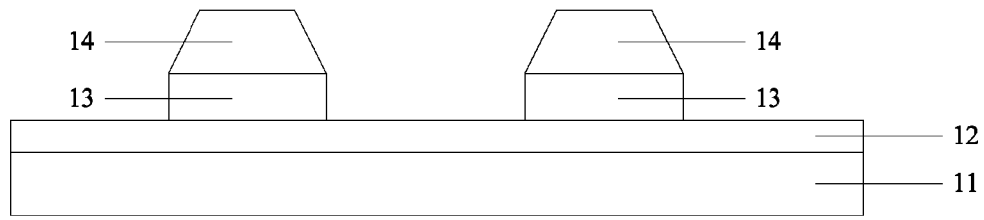
FIG. 7 is a schematic diagram showing the sectional structure of a resin film during the process for patterning a graphene layer according to another embodiment of the invention.

205: etching the isolation layer 13 according to the patterned photoresist layer 14 to form a patterned isolation layer 13;

Referring to FIG. 7, the isolation layer 13 exposed after step 204 is etched under the protection of the patterned photoresist layer 14. The etching here may be physical etching or chemical etching. When a chemical etching is employed, if the material of the isolation layer 13 is an inorganic silicon compound material, hydrofluoric acid may be employed for corroding; if the material of the isolation layer 13 is a metal material, the metal may be dissolved via a chemical replacement. Since the isolation layer will be peeled off finally, wet etching that has a rapid etching speed may be preferably employed, i.e., chemical etching, so that the production cost may be lowered.

Figure 8:
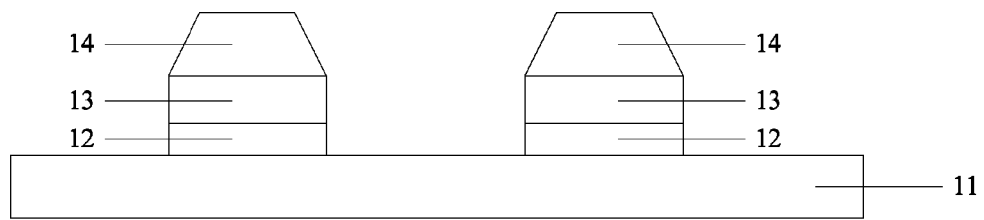
FIG. 8 is a schematic diagram showing the sectional structure of a resin film during the process for patterning a graphene layer according to another embodiment of the invention.

206: etching the graphene layer 12 according to the patterned isolation layer 13 to form a patterned graphene layer 12, as shown in FIG. 8;

Since wet etching has a characteristic of isotropy, the integrity of the edge of the patterned graphene layer 12 formed cannot be guaranteed, a dry etching process, i.e., a physical etching process, is preferably employed in step 206 to form a patterned graphene layer. Compared with wet etching, dry etching has the characteristic of good anisotropy, thus a flattening edge can be formed for the patterned graphene layer 12.

Figure 9:
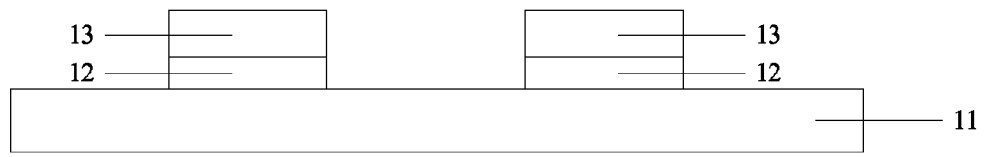
FIG. 9 is a schematic diagram showing the sectional structure of a resin film during the process for patterning a graphene layer according to another embodiment of the invention.

207: peeling off the patterned photoresist layer 14;

As shown FIG. 9, a known method is used to peel off the patterned photoresist layer 14. Optionally, the step 207 may also be performed after the step 205.

208: removing the patterned isolation layer 13.

Figure 10:
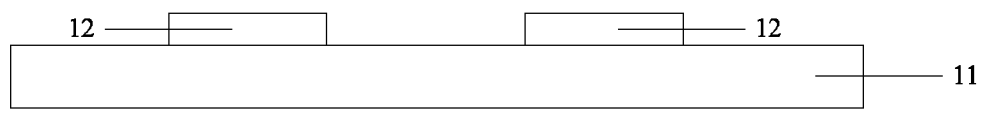
FIG. 10 is a schematic diagram showing the sectional structure of a resin film during the process for patterning a graphene layer according to another embodiment of the invention.

Referring to FIG. 10, in step 208, when an inorganic silicon compound material is employed for the isolation layer, chemical etching may be employed, that is, the patterned isolation layer may be corroded via hydrofluoric acid. If the material of the isolation layer is a metal material, the metal may be dissolve via chemical replacement, or it may be directly peeled off. In this step, a resin film with the patterned graphene layer 12 is formed after removing the patterned isolation layer 13.

Figure 11:
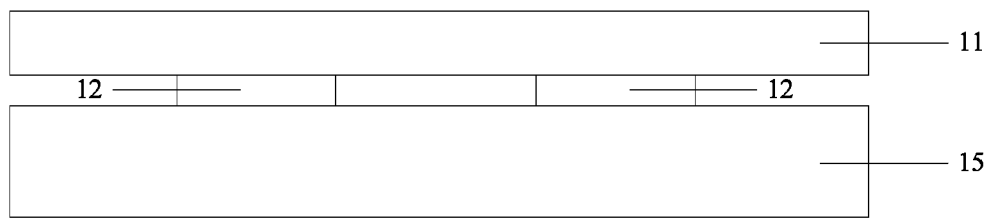
FIG. 11 is a schematic diagram showing the sectional structure of a resin film during the process for patterning a graphene layer according to another embodiment of the invention.

209: transferring the patterned graphene layer 12 on the resin film to a substrate 15 via transfer process, as shown FIG. 11;

210: removing the resin base at the resin film.

Figure 12:
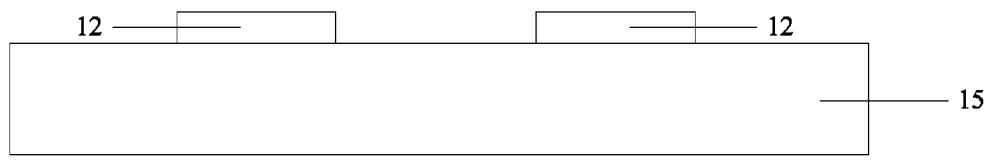
FIG. 12 is a schematic diagram showing the sectional structure of a resin film during the process for patterning a graphene layer according to another embodiment of the invention.

Referring to FIG. 12, when a base of PMMA material is employed, an organic solvent such as acetone may be employed to dissolve the PMMA base. A patterned graphene layer 12 may be formed on the substrate via step 210.

In the method for patterning a graphene layer according to the embodiments of the invention, by providing an isolation layer between a graphene layer and a photoresist and removing the isolation layer on the graphene layer after peeling off the photoresist, the unfavorable condition of the prior art may be avoided that a graphene film sloughs off or a photoresist remains on a graphene film when a photoresist material is peeled off, and thus the product yield can be improved in the case that the production cost is controlled.

Figure 13:
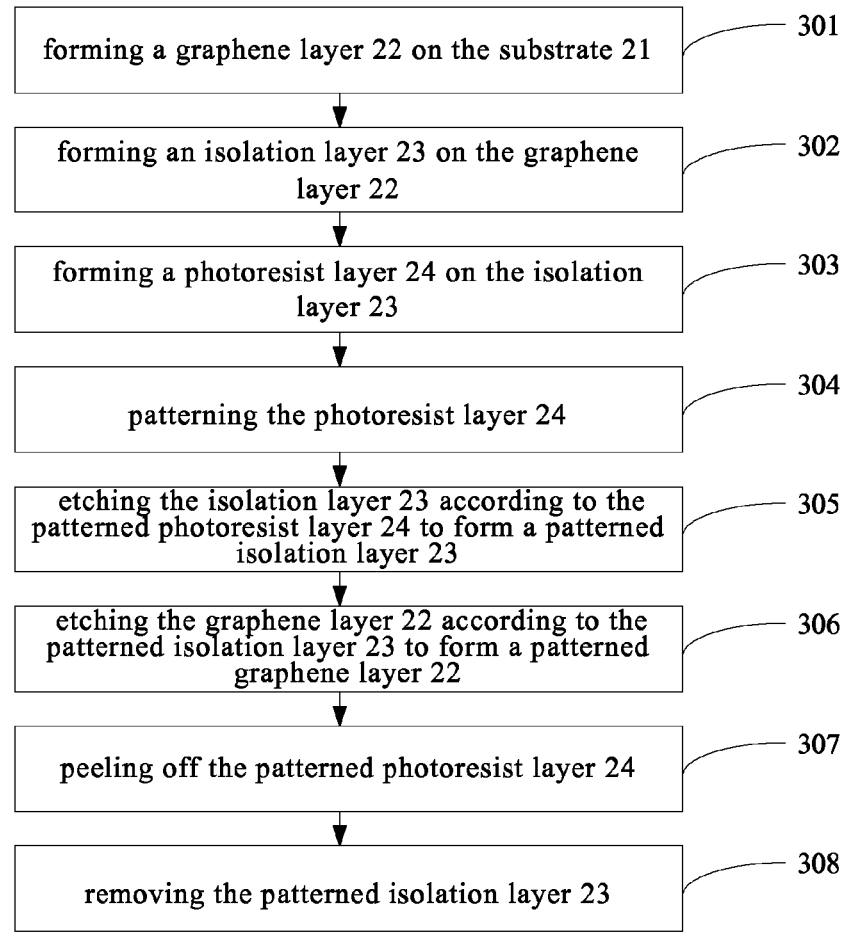
FIG. 13 is a schematic flow chart of a method for patterning graphene layer according to a further embodiment of the invention.
Figure 14:
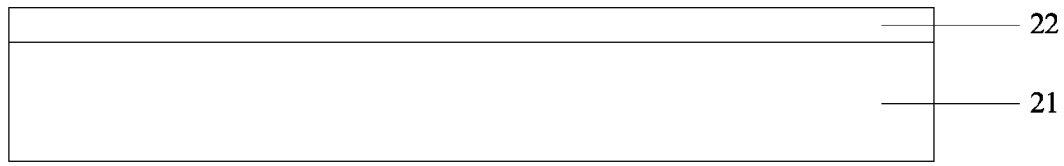
FIG. 14 is a schematic diagram showing the sectional structure of a substrate during the process for patterning a graphene layer according to a further embodiment of the invention.
Figure 15:
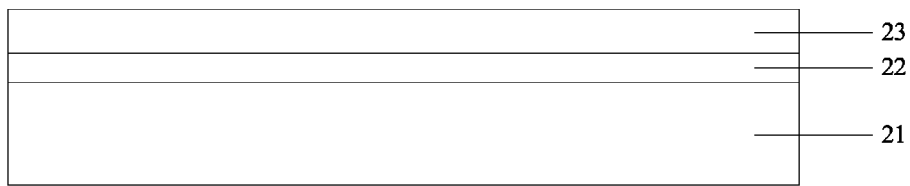
FIG. 15 is a schematic diagram showing the sectional structure of a substrate during the process for patterning a graphene layer according to a further embodiment of the invention.

In another embodiment of the invention, there provides a method for patterning a graphene layer. Referring to FIG. 13, the method specifically comprises the steps below:

301: forming a graphene layer 22 on the substrate 21;

Referring to FIG. 14, a layer of graphene material is deposited on the substrate 21 via Plasma Enhanced Chemical Vapor Deposition (PECVD), or a layer of water-soluble single-layer or multi-layer graphene material is spin-coated on the substrate 21, to form a graphene layer 22. When the material directly contacting with the graphene layer 22 on the substrate 21 is a resin material, the method of the step 201 is employed to form a graphene layer on the substrate.

302: forming an isolation layer 23 on the graphene layer 22;

Specifically, reference may be made to the step 202, and it will not be described again here.

Figure 16:
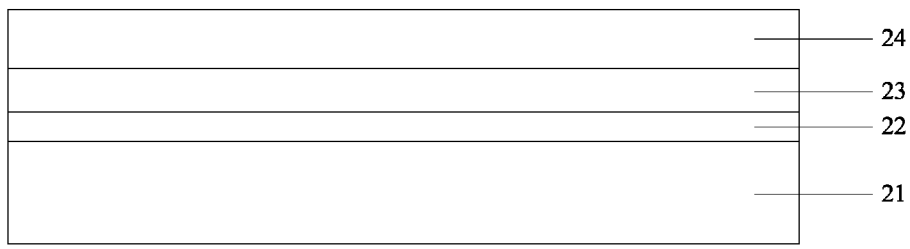
FIG. 16 is a schematic diagram showing the sectional structure of a substrate during the process for patterning a graphene layer according to a further embodiment of the invention.
Figure 17:
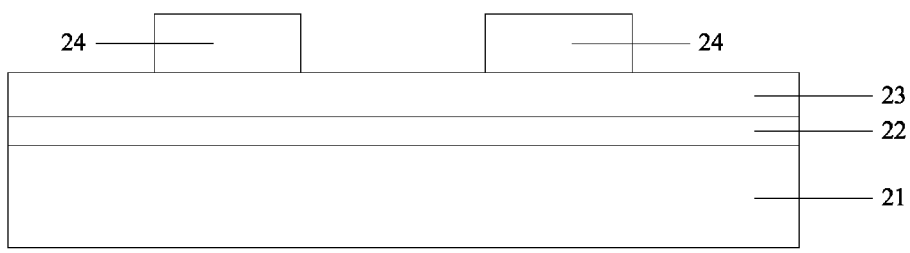
FIG. 17 is a schematic diagram showing the sectional structure of a substrate during the process for patterning a graphene layer according to a further embodiment of the invention.
Figure 18:
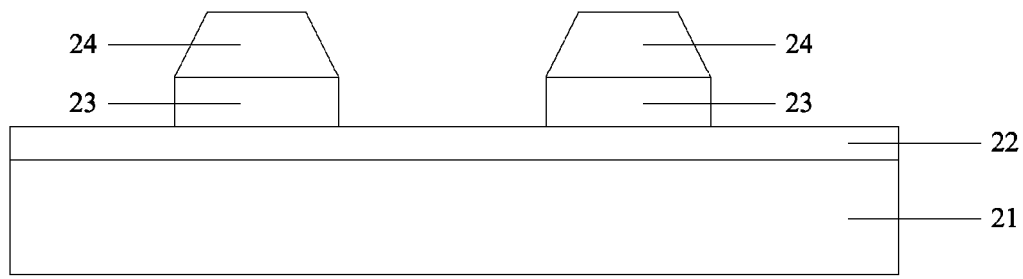
FIG. 18 is a schematic diagram showing the sectional structure of a substrate during the process for patterning a graphene layer according to a further embodiment of the invention.
Figure 19:
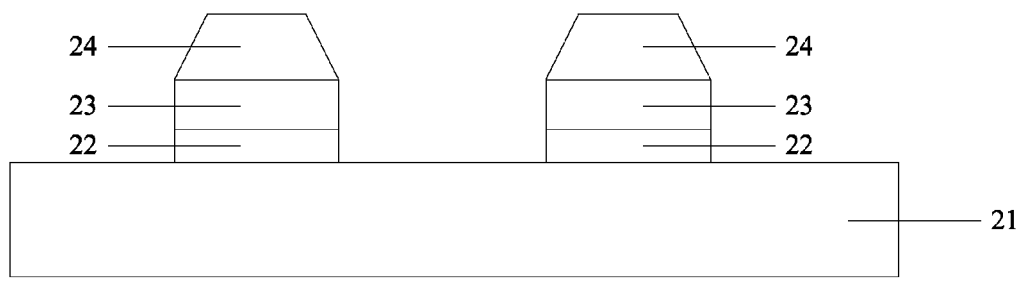
FIG. 19 is a schematic diagram showing the sectional structure of a substrate during the process for patterning a graphene layer according to a further embodiment of the invention.
Figure 20:
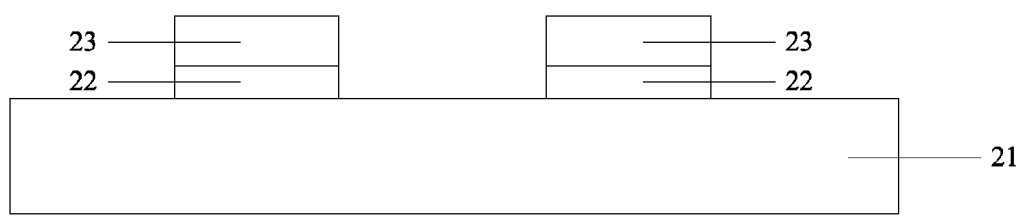
FIG. 20 is a schematic diagram showing the sectional structure of a substrate during the process for patterning a graphene layer according to a further embodiment of the invention.

303: forming a photoresist layer 24 on the isolation layer 23, as shown in FIG. 16;

304: patterning the photoresist layer 24, as shown FIG. 17;

305: etching the isolation layer 23 according to the patterned photoresist layer 24 to form a patterned isolation layer 23, as shown FIG. 18;

306: etching the graphene layer 22 according to the patterned isolation layer 23 to form a patterned graphene layer 22, as shown FIG. 19;

307: peeling off the patterned photoresist layer 24, as shown FIG. 20;

The step 307 may also be performed after the step 305.

Figure 21:
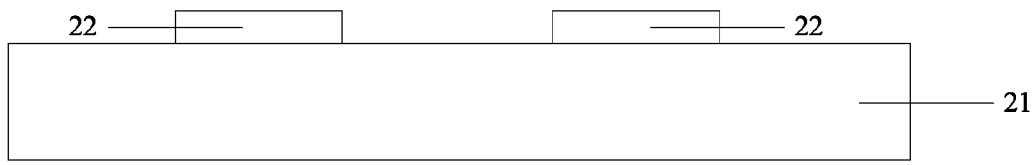
FIG. 21 is a schematic diagram showing the sectional structure of a substrate during the process for patterning a graphene layer according to a further embodiment of the invention.

308: removing the patterned isolation layer 23, as shown FIG. 21.

For the preparation process employed in each step, reference may be made to the process in the above other embodiments, and it will not be described again here.

In the method for patterning a graphene layer according to the embodiments of the invention, by providing an isolation layer between a graphene layer and a photoresist and removing the isolation layer on the graphene layer after peeling off the photoresist, the unfavorable condition of the prior art may be avoided that a graphene film sloughs off or a photoresist remains on a graphene film when a photoresist material is peeled off, and thus the product yield can be improved in the case that the production cost is controlled.

In another aspect of the invention, the invention provides a method for manufacturing a display substrate, which comprises: manufacturing a structure formed of a patterned graphene layer by any method according to the above embodiments. The structure formed of the patterned graphene layer may at least include: an active layer, a gate electrode and a drain electrode, a data line, a gate line, a transparent pixel electrode and a common electrode of a switching apparatus in a display substrate; a transparent touch electrode in a touch screen; and other transparent conducting structures.

In the method for manufacturing a display substrate according to the embodiments of the invention, by providing an isolation layer between a graphene layer and a photoresist and removing the isolation layer on the graphene layer after peeling off the photoresist, the unfavorable condition of the prior art may be avoided that a graphene film sloughs off or a photoresist remains on a graphene film when a photoresist material is peeled off, and the thus product yield can be improved in the case that the production cost is controlled.

The above description only shows some preferred implementation modes of the invention, rather than limiting the protection scope of the invention thereto. Any variations and substitutions made by one skilled in the art without departing from the technical principles of the invention should be contemplated by the protection scope of the invention. Therefore, the protection scope of the invention should be defined by the appended claims.

What is claimed is:

1. A method for patterning a graphene layer, comprising:
   forming an isolation layer on the graphene layer;
   forming a photoresist layer on the isolation layer;
   patterning the photoresist layer;
   etching the isolation layer according to the patterned photoresist layer to form a patterned isolation layer;
   etching the graphene layer according to the patterned isolation layer to form a patterned graphene layer; and
   removing the patterned isolation layer,
   wherein the method further comprises:
   forming the graphene layer with a resin base before forming the isolation layer on the graphene layer; and
   forming a resin film with the patterned graphene layer after removing the patterned isolation layer.

2. The method according to claim 1, further comprises:
   peeling off the patterned photoresist layer after etching the isolation layer according to the patterned photoresist layer to form the patterned isolation layer.

3. The method according to claim 1, further comprises:
   transferring the patterned graphene layer on the resin film to a substrate via a transfer process; and
   removing the resin base at the resin film.

4. The method according to claim 1, wherein the step forming the graphene layer with the resin base comprises:
   spin-coating a single-layer or multiple layers of water-soluble graphene material on the resin base to form the graphene layer.

5. The method according to claim 1, wherein the step of forming the graphene layer with the resin base comprises:
   depositing a graphene material on a metal base to form the graphene layer;
   spin-coating a resin material on the graphene layer to form the resin base; and
   etching and removing the metal base.

6. The method according to claim 5, wherein the material of the metal base includes any one of copper, nickel or copper-nickel alloy.

7. The method according to claim 1, wherein the isolation layer is formed of an inorganic silicon compound material.

8. The method according to claim 7, wherein the inorganic silicon compound material is silicon nitride.

9. The method according to claim 8, wherein the step of removing the patterned isolation layer comprises:
   corroding and removing the patterned isolation layer via hydrofluoric acid.

10. The method according to claim 1, wherein the graphene layer is formed on a substrate.

11. The method according to claim 1, wherein the material of the isolation layer is a metal material.

12. The method according to claim 11, wherein the metal material comprises any one of copper, nickel or copper-nickel alloy.

13. A method for manufacturing a display substrate, comprising manufacturing a structure formed of the patterned graphene layer by the method according to claim 1.

14. A method for patterning a graphene layer, comprising:
    forming an isolation layer on the graphene layer;
    forming a photoresist layer on the isolation layer;
    patterning the photoresist layer;
    etching the isolation layer according to the patterned photoresist layer to form a patterned isolation layer;
    etching the graphene layer according to the patterned isolation layer to form a patterned graphene layer; and
    removing the patterned isolation layer,
    wherein the method further comprises:
    forming the graphene layer on a resin base before forming the isolation layer on the graphene layer; and
    forming a resin film with the patterned graphene layer after removing the patterned isolation layer.

15. The method according to claim 14, wherein the step forming the graphene layer on the resin base comprises:
    spin-coating a single-layer or multiple layers of water-soluble graphene material on the resin base to form the graphene layer.

* * * * *